United States Patent [19]

Ofori-Tenkorang et al.

[11] Patent Number: 4,987,372
[45] Date of Patent: Jan. 22, 1991

[54] POTENTIOMETER STATE SENSING CIRCUIT

[75] Inventors: John Ofori-Tenkorang, Cambridge; David Otten, Newton, both of Mass.; Leo Casey, Briarcliff Manor, N.Y.

[73] Assignee: Lutron Electronics Co., Inc., Coopersburg, Pa.

[21] Appl. No.: 388,197

[22] Filed: Aug. 1, 1989

[51] Int. Cl.⁵ .......................................... G01R 27/02
[52] U.S. Cl. .................................... 324/705; 324/711; 340/870.38
[58] Field of Search ............... 324/704, 705, 711, 714, 324/715, 723; 340/870.38, 870.04; 338/118

[56] References Cited

U.S. PATENT DOCUMENTS

| | | | |
|---|---|---|---|
| 2,099,349 | 11/1937 | Rosebury | 324/723 |
| 2,772,395 | 11/1956 | Runaldue et al. | 324/714 |
| 2,803,799 | 8/1957 | Siegel et al. | 324/704 |
| 3,172,038 | 3/1965 | Goodman, Jr. | 324/714 |
| 3,372,332 | 3/1968 | Michell et al. | 324/715 |
| 3,555,298 | 1/1971 | Neelands | 307/235 |
| 3,852,665 | 12/1974 | Bothner | 324/723 |
| 3,886,448 | 5/1975 | Drabenko et al. | 324/723 |
| 3,895,288 | 7/1975 | Lampen et al. | 323/94 R |
| 3,916,327 | 10/1975 | Lampen et al. | 328/147 |
| 3,968,467 | 7/1976 | Lampen et al. | 338/119 |
| 4,247,816 | 1/1981 | Harrer et al. | 324/714 |
| 4,494,105 | 1/1985 | House | 338/114 |
| 4,608,553 | 8/1986 | Ormond | 340/347 |
| 4,622,536 | 11/1986 | Shih et al. | 340/347 |
| 4,647,906 | 3/1987 | Naylor et al. | 340/347 |
| 4,803,420 | 2/1989 | Steinbrecher et al. | 340/870.38 |
| 4,841,221 | 5/1989 | Barney et al. | 324/714 |
| 4,864,513 | 9/1989 | Levine et al. | 324/691 |

Primary Examiner—Reinhard J. Eisenzopf
Assistant Examiner—Maura K. Regan

[57] ABSTRACT

A circuit for sensing the state of a potentiometer includes a capacitor that is connected to the potentiometer wiper and that is successively charged by applying a voltage to each end of the potentiometer resistive element. The capacitor is discharged between successive chargings. The times needed to charge the capacitor to a predetermined voltage in each case are used to determine the position of the wiper along the resistive element. The circuit can be connected to a plurality of potentiometers, any one of which can be selected and the wiper position determined. A similar circuit can determine the state of an inductive or capacitive voltage divider.

41 Claims, 2 Drawing Sheets

POTENTIOMETER STATE SENSING CIRCUIT

BACKGROUND OF THE INVENTION

1. Field of the Invention

This invention relates to potentiometers and more specifically, to a low cost circuit for sensing the state of a potentiometer.

2. Description of the Related Art

Voltage dividers—generally referred to herein as "potentiometers"—are commonly used circuit elements. A typical potentiometer comprises a resistive element, a conductive element, and a wiper that has two or more metal contacts which provide movable electrical contact between points along the elements. As the wiper moves along the elements, it continuously varies the resistance between the conductive element and either end of the resistive element. A voltage across the resistive element is divided by the wiper according to its position along the resistive element, the wiper voltage being determined by the resistance from the wiper to either end of the resistive element.

Another type of potentiometer is the SoftPot® membrane potentiometer, manufactured by Spectra Symbol, Salt Lake City, Utah. It provides a momentary variable resistance in response to an applied pressure. A membrane potentiometer generally consists of a conductive element co-extensively mounted parallel to a resistive element and separated by a small gap. One or both of the elements are supported by a flexible substrate, which can be deflected (by a finger or the like) to electrically connect corresponding points along the conductive and resistive elements, electrically dividing the resistive element accordingly. The elements separate when the deflecting pressure is released.

Potentiometers are frequently used to adjust some output parameter of an electric control, such as a lighting control. To accomplish this, a circuit must be provided to sense the state of the potentiometer and adjust the control accordingly. If the control circuit is analog, this is easily done via a buffer of some sort connected to the potentiometer wiper. If, on the other hand, the control circuit includes a digital processing step, the sensing circuit must convert an analog signal into a digital signal (A/D conversion). There are many circuits available to do this; however, each suffers from limitations, as discussed below.

A/D conversion by successive approximation involves feeding back various output codes into a D/A converter and comparing this with the input voltage signal via a comparator. Typically, all bits are initially set to 0. Then, beginning with the most significant bit, each bit, in turn, is provisionally set to 1. If the D/A output does not exceed the input voltage signal, the bit is left as a 1; otherwise, it is set back to 0.

Successive-approximation A/D converters are relatively accurate and fast; however, they are expensive and draw a significant amount of current during operation. Furthermore, voltage spikes on the input line are disastrous, and these converters sometimes have nonlinearities and missing codes.

A less expensive A/D conversion method, known as single-slope integration, involves measuring the elapsed time to charge a capacitor from ground to a voltage equivalent to the input voltage signal. To begin conversion, an internal ramp generator is started and, at the same time, a counter is enabled to count pulses from a stable clock. When the ramp voltage equals the input voltage, a comparator stops the counter. The count is proportional to the input level, i.e., it's the digital output. At the end of the conversion, the circuit resets the ramp generator and the counter, and the converter is ready for another cycle. Single-slope integration is simple, but it is not used where high accuracy is required, because it puts severe requirements on the stability and accuracy of the ramp generator and comparator.

The method of dual-slope integration was designed to eliminate most of the ramp generator and comparator problems inherent in single-slope integration. In this method, a current that is accurately proportional to the input level charges a capacitor for a fixed time interval; then, the capacitor is discharged by a constant current until the voltage reaches zero again. The time to discharge the capacitor is proportional to the input level and is used to enable a counter driven from a clock running at a fixed frequency. The final count is proportional to the input level; i.e., it's the digital output.

Dual-slope integration achieves good accuracy without putting extreme requirements on component stability. In particular, the capacitor value doesn't have to be particularly stable, since the charge cycle and the discharge cycle both have a rate inversely proportional to the value of the capacitor. Likewise, drifts or scale errors in the comparator are cancelled out by beginning and ending each conversion cycle at the same voltage. The clock frequency does not have to be highly stable, because the fixed integration time during the first phase of the measurement is generated by subdivision from the same clock used to increment the counter. The dual-slope converter, however, requires that the discharge current be highly stable and that the input current accurately represent the voltage on the potentiometer wiper. Furthermore, this method draws a significant amount of current during operation. In the case of lighting controls, it is desirable to reduce the current drawn by an A/D converter to 5 mA or less to meet certain Underwriters Laboratories specifications.

SUMMARY OF THE INVENTION

The present invention provides a potentiometer state sensing circuit generally comprising a capacitor electrically connected to the wiper of a potentiometer such that the capacitor can be charged by application of a voltage to either end of the potentiometer resistive element. By "electrically connected," we mean that there is a conductive path between the capacitor and the wiper, although one or more additional circuit elements can be between them. When the capacitor reaches a predetermined voltage, a counter is stopped, the count corresponding to the elapsed charging time of the capacitor. By charging the capacitor from one end of the resistive element, discharging it, and then charging the capacitor from the other end of the resistive element, while recording the elapsed charging time in both cases, the state of the potentiometer is determined as a function of the two charging times. For the purpose of this specification and appended claims, "conductive" and "resistive" are relative terms describing electrical elements. Thus, the essential feature of a resistive element is electrical resistance and the essential feature of a conductive element is electrical conduction.

A circuit for sensing a state of a potentiometer, having a first impedance device and a conductive element that electrically divides said impedance device into first and second ends comprises, in combination:

(a) a second impedance device electrically connected to said conductive element, said second impedance device and said first and second ends of said first impedance device having first and second time constants associated therewith, respectively,
(b) means for applying a voltage alternately across said second impedance device and either end of said first impedance device, and
(c) means for measuring the relative values of said first and second time constants, whereby the state of said potentiometer is determined by said relative values.

A circuit for sensing a state of a potentiometer, having a resistive element and a wiper that electrically divides said resistive element into first and second ends comprises, in combination:
(a) a capacitor having one end electrically connected to said wiper,
(b) means for applying a first predetermined voltage to alternately charge said capacitor through said first and second ends of said resistive element,
(c) means for detecting when the voltage across said capacitor reaches a second predetermined voltage,
(d) means for measuring first and second time intervals, corresponding to said first and second ends, respectively, between application of said first predetermined voltage and detection of said second predetermined voltage, and
(e) means for discharging said capacitor during periods of time between said measurements, wherein the state of said potentiometer can be determined from said first and second time intervals.

A circuit for sensing a state of a plurality of potentiometers, each having a resistive element and a wiper that electrically divides said resistive element into first and second ends comprises, in combination:
(a) a capacitor having one end electrically connected to said wiper of each of said potentiometers,
(b) means for applying a first predetermined voltage to alternately charge said capacitor through said first and second ends of said resistive element of a potentiometer selected from said plurality of potentiometers,
(c) means for detecting when the voltage across said capacitor reached a second predetermined voltage,
(d) means for measuring first and second time intervals, corresponding to said first and second ends of said selected potentiometer, respectively, between application of said first predetermined voltage and detection of said second predetermined voltage, and
(e) means for discharging said capacitor during periods of time between said measurements, wherein the state of said selected potentiometer can be determined from said first and second time intervals.

DETAILED DESCRIPTION OF THE INVENTION

Figure 1:
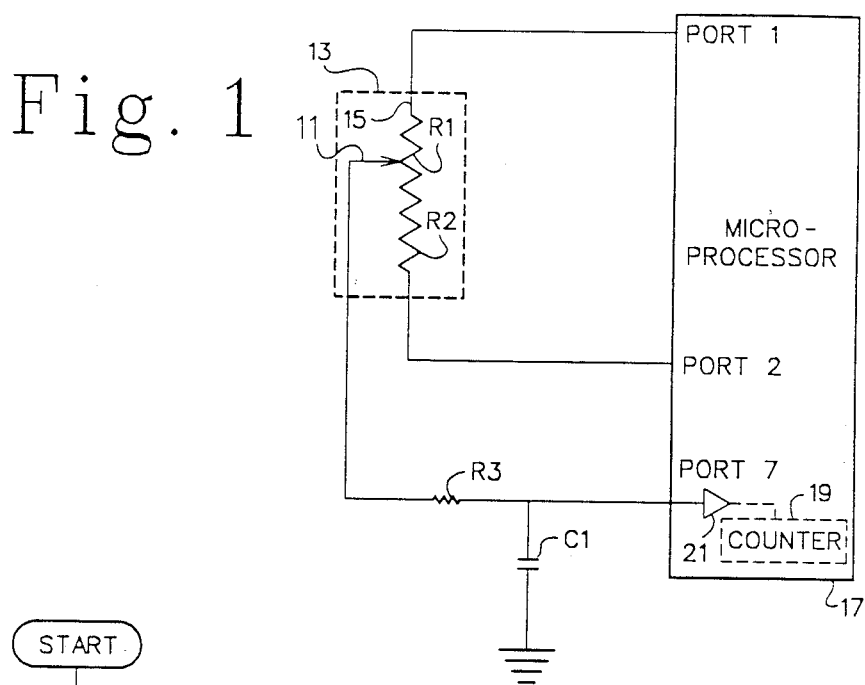
FIG. 1 is a schematic diagram of a potentiometer state sensing circuit of the present invention.

FIG. 1 shows a schematic diagram of a potentiometer state sensing circuit of the present invention. Wiper 11 of potentiometer 13 electrically divides resistive element 15 into two resistances, R1 and R2, which are electrically connected to capacitor C1 through wiper 11 and optional resistor R3. Capacitor C1 can be charged through either R1 or R2 by applying a supply voltage $V_S$ through port 1 or 2, respectively, of microprocessor 17. Optional resistor R3 limits the current through capacitor C1 when either R1 or R2 is essentially zero. R3 is preferably negligible compared with the sum of R1 and R2. Microprocessor 17, preferably a Motorola 68HC05, controls the application of voltage to ports 1 and 2. It includes a free running counter 19, connected to port 7, for counting the number of clock cycles it takes to charge capacitor C1 from essentially ground to the threshold voltage $V_T$ of port 7 input buffer 21. A diac, Zener diode, Schmitt trigger, or any other type of triggering device can alternatively be connected to port 7 to provide an abrupt transition if the input port of the microprocessor requires it.

Port 7 is preferably an interrupt port. This enables microprocessor 17 to perform other tasks while capacitor C1 is charging and then return to service the interrupt signal when the capacitor voltage $V_C$ exceeds the threshold voltage $V_T$ of input buffer 21. Port 7 can alternatively be an input capture pin such that when the capacitor voltage $V_C$ exceeds the threshold voltage $V_T$, microprocessor 17 automatically latches the value of counter 19 into a register and sets a status bit to indicate that the count was captured. In either case, the total count (say M) to charge C1 through R1 and the count (say N) to charge C1 through R2 are used by microprocessor 17 to determine the state of potentiometer 13 (i.e., the position of wiper 11).

Figure 2:
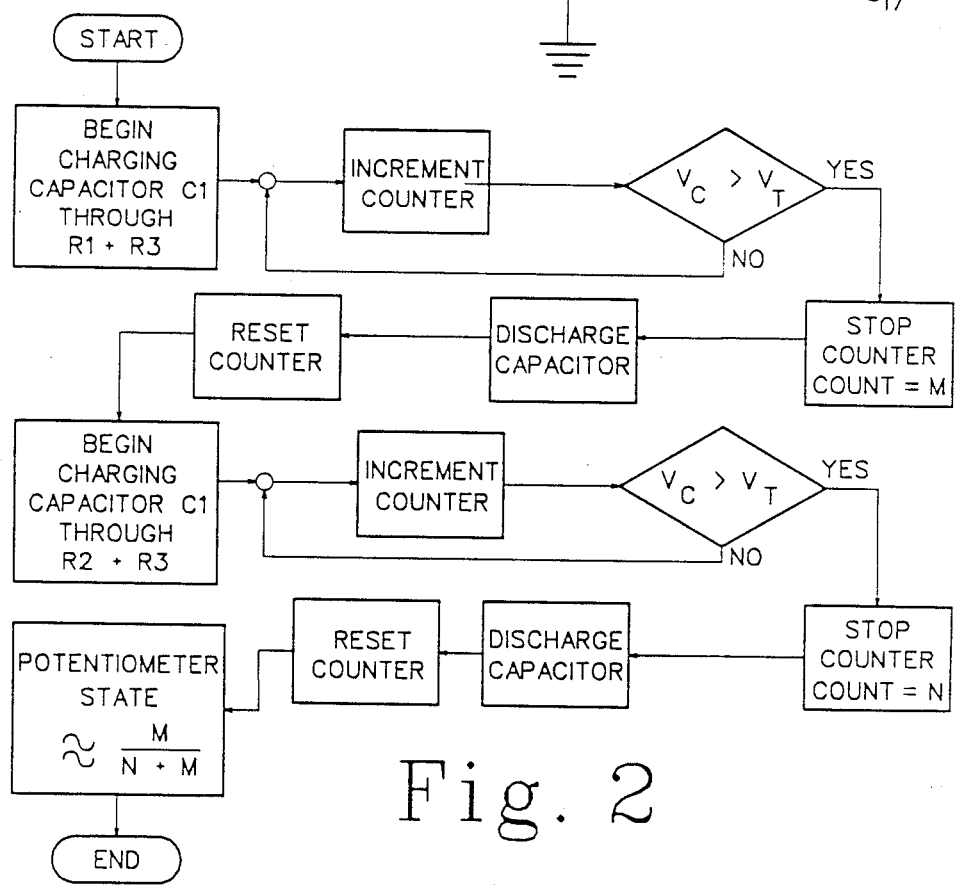
FIG. 2 is a flow diagram of the circuit of FIG. 1.

FIG. 2 is a simplified flow diagram showing how the circuit of FIG. 1 operates. Assume that capacitor C1 is initially uncharged. Beginning at the "start" block, microprocessor 17 initially provides a supply voltage $V_S$ (corresponding to a high bit) to port 1 and disconnects port 2, charging capacitor C1 through resistors R1 and R3. The initial counter value is simultaneously latched into a register. As capacitor C1 charges, counter 19 is incremented at a rate determined by a digital clock (not shown). When the voltage $V_C$ across capacitor C1 exceeds the threshold voltage $V_T$ of input buffer 21, the final counter value is latched into another register, and the elapsed count M is determined by the difference between the final and initial counter values. Ports 1 and 2 are pulled low, discharging capacitor C1 to ground through resistors R1 and R2. Microprocessor 17 then disconnects port 1 and applies a voltage $V_S$ to port 2, charging capacitor C1 through resistors R2 and R3. The initial counter value is simultaneously latched into a register. Counter 19 is incremented until $V_C$ exceeds $V_T$, at which time the final counter value is latched into another register, the elapsed count N being the difference between the final and initial counter values. The capacitor is again discharged to ground.

The state of potentiometer 13 is determined as follows:

$$V_T = V_S(1 - e^{-M/(R1+R3)C1}) \text{ — charging } C1 \text{ through } R1 \text{ —}$$

and $$V_T = V_S(1 - e^{-N/(R2+R3)C1}) \text{ — charging } C1 \text{ through } R2 \text{ —}$$

Therefore: $\dfrac{M}{(R1+R3)C1} = \dfrac{N}{(R2+R3)C1}$

When R3 is small compared with R1 and R2, $$\frac{M}{(R1)C1} \sim \frac{N}{(R2)C1}$$

which can be simplified to:

$$\frac{R1}{R2} \sim \frac{M}{N} \text{ or } \frac{R1}{R1+R2} \sim \frac{M}{M+N}$$

Thus, the wiper position, as defined by a ratio of resistance R1 to the total resistance R1+R2, is determined simply by the count M divided by the sum of counts M and N, which is easily calculated by microprocessor 17. Although FIG. 2 shows this calculation to occur after C1 is discharged, the two steps may occur simultaneously. Near the endpoints of wiper travel, R3 may not be negligible compared with R1 and R2, but the inaccuracy introduced thereby is not a problem, in practice. In general, the accuracy and stability of the digital output can optionally be increased by repeatedly sensing the state of the potentiometer and averaging the values over time.

The discharging times of capacitor C1 through resistors R1 and R2 can be similarly measured to determine the state of potentiometer 13. In this case, ports 1 and 2 are pulled high to charge capacitor C1 to $V_S$. Microprocessor 17 then provides a low bit to port 1 and disconnects port 2, discharging capacitor C1 through resistors R1 and R3. The steps are repeated and capacitor C1 is discharged through resistors R2 and R3. The state of potentiometer 13 is determined by the corresponding discharging times.

A similar method may be used to determine the state of any type of potentiometer, including capacitive and inductive voltage dividers. A time constant corresponding to each end of the voltage divider is measured, and the state is determined as a function of the two time constants.

Figure 3:
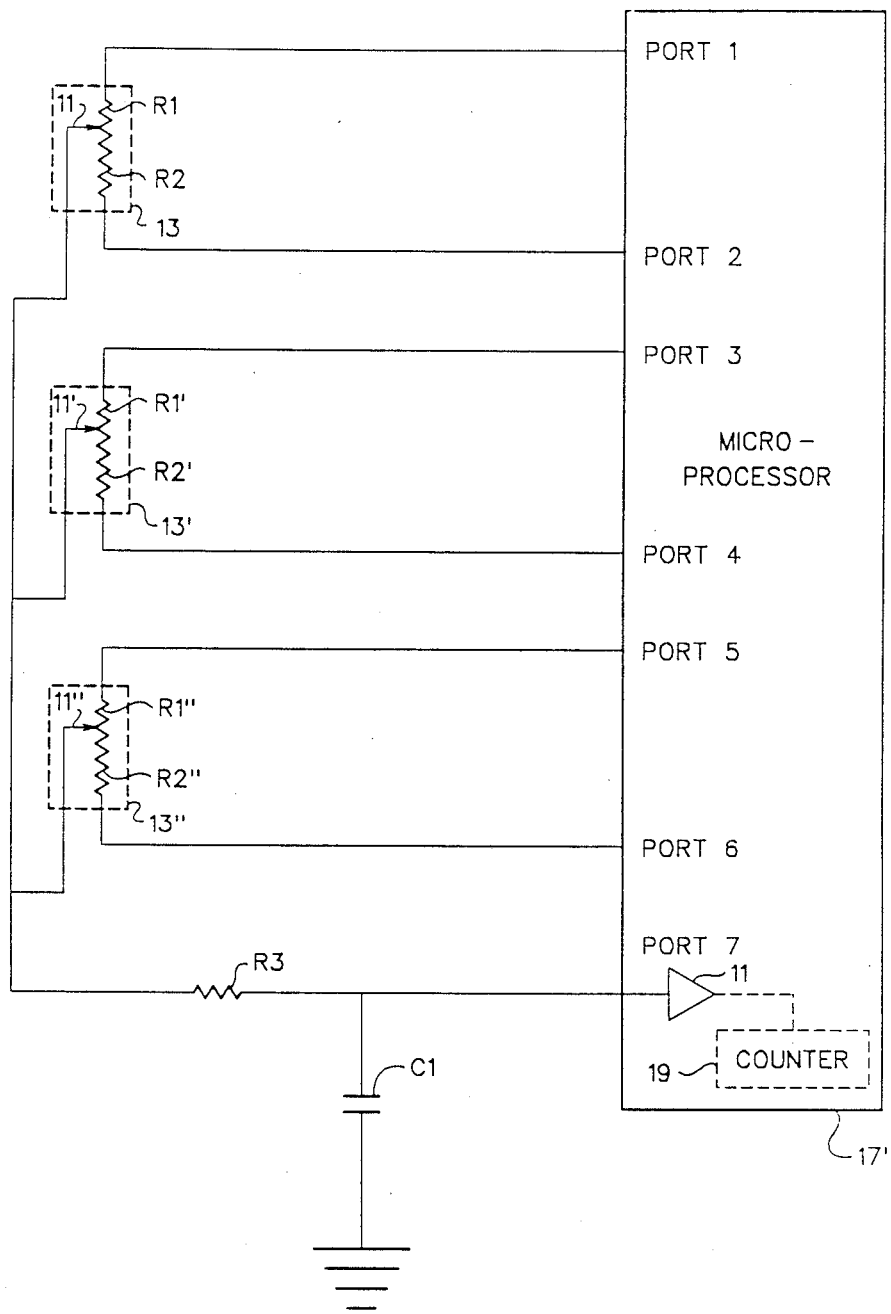
FIG. 3 is a schematic diagram of an alternative circuit for selectively sensing the state of each of a plurality of potentiometers.

FIG. 3 shows a simplified schematic diagram of an alternative circuit of the present invention for selectively sensing the state of a plurality of potentiometers. The circuit functions substantially the same as the circuit shown in FIG. 1, except that microprocessor 17 can selectively determine the state of any one of a plurality of potentiometers 13, 13' or 13''. To determine the state of potentiometer 13', for example, microprocessor 17 first provides a high bit to port 3 and disconnects ports 1, 2, 4, 5, and 6, charging capacitor C1 through resistors R1' and R3. Counter 19 is incremented until the capacitor voltage $V_C$ exceeds the threshold voltage $V_T$ of input buffer 21, the elapsed count corresponding to some number M'. Ports 1 through 6 are pulled low to discharge capacitor C1. Microprocessor 17 then provides a high bit to port 4 and disconnects ports 1, 2, 3, 5, and 6, charging capacitor C1 through resistors R2' and R3. The counter is incremented until $V_C$ again exceeds $V_T$, the new elapsed count corresponding to some number N'. Capacitor C1 is again discharged by pulling ports 1–6 low. Microprocessor 17 calculates the state of potentiometer 13' as the ratio M'/(M'+N'). The process is similar for determining the states of potentiometers 13 and 13''. Any number of potentiometers can be added to the circuit of FIG. 3, as long as microprocessor 17 includes two output ports for each potentiometer added. Alternatively, any number of potentiometers can be switched into or out of the circuit via a switching circuit, such as that disclosed in U.S. Pat. No. 4,689,547, issued Aug. 25, 1987, to Rowen et al, incorporated herein by reference. The state of the potentiometers can be sequentially determined or, preferably, the state of a particular potentiometer is determined only when it is adjusted.

The long-term accuracy or stability of capacitor C1 does not affect the accuracy of the potentiometer state sensing circuit since the capacitor value drops out of the equations as shown above. Likewise, the long-term stability of the threshold voltage $V_T$ and the supply voltage $V_S$ do not effect the accuracy of the state sensing circuit, as long as the output ports 1–6 exhibit similar impedance characteristics (which is usually the case in practice). If the clock speed drifts (due to variations in ambient temperature, for example), the counts M and N will be affected equally and, thus, the ratio M/(M+N) will be unaffected. Even if the value of potentiometer resistive element 15 drifts, the ratio of R1/(R1+R2) will remain constant and equal to M/(M+N). Resistors R1 and R2 and capacitor C1 are preferably selected such that the circuit described above draws less than 5 mA during operation. The circuit of the present invention converts an analog state of a potentiometer into a digital signal quickly, accurately, and, since none of the components need be particularly stable, inexpensively.

It is envisioned that the present invention, as disclosed in this specification, can be used in any application requiring digital encoding of an adjustable analog potentiometer. Since certain changes can be made to the potentiometer state sensing circuit disclosed above without departing from the scope of the invention herein described, it is intended that all matter contained in the above description or shown in the accompanying drawings shall be interpreted in an illustrative and not a limiting sense.

We claim:

1. A circuit for sensing a state of a potentiometer, having a first impedance device and a conductive element that electrically divides said impedance device into first and second ends, comprising, in combination:
    (a) a second impedance device electrically connected to said conductive element, said second impedance device and said first and second ends of said first impedance device having first and second time constants associated therewith, respectively,
    (b) means for applying a voltage alternatively across said second impedance device and either end of said first impedance device, and
    (c) means for measuring the relative values of said first and second time constants,
whereby the state of said potentiometer is determined by said relative values.

2. The circuit of claim 1 wherein said first impedance device comprises a resistive element.

3. The circuit of claim 1 wherein said first impedance device comprises a capacitive element.

4. The circuit of claim 1 wherein said first impedance device comprises an inductive element.

5. A circuit for sensing a state of a potentiometer, having a resistive element and a wiper that electrically divides said resistive element into first and second ends, comprising, in combination:
    (a) a capacitor having one end electrically connected to said wiper,
    (b) means for applying a first predetermined voltage to alternately charge said capacitor through said first and second ends of said resistive element, (c) means for detecting when the voltage across said capacitor reaches a second predetermined voltage, (d) means for measuring first and second time intervals, corresponding to said first and second ends, respectively, between application of said first predetermined voltage and detection of said second predetermined voltage, and (e) means for discharging said capacitor during periods of time between said measurements, wherein the state of said potentiometer can be determined from said first and second time intervals.

6. The circuit of claim 5 wherein said potentiometer comprises a linear potentiometer.

7. The circuit of claim 5 wherein said potentiometer comprises a rotary potentiometer.

8. The circuit of claim 5 wherein said potentiometer comprises elongated conductive and resistive elements separated by a small gap and juxtaposed substantially co-extensively between substrates, at least one of which is flexible.

9. The circuit of claim 5 further comprising a current limiting resistor electrically connected between said capacitor and said wiper.

10. The circuit of claim 5 wherein the value of said current limiting resistor is much smaller than the value of said resistive element.

11. The circuit of claim 5 wherein said means for applying a voltage comprises an output port of a microprocessor.

12. The circuit of claim 5 wherein said detecting means comprises an input buffer of a microprocessor.

13. The circuit of claim 5 wherein said detecting means comprises a Zener diode.

14. The circuit of claim 5 wherein said detecting means comprises a diac.

15. The circuit of claim 5 wherein said detecting means comprises a Schmitt trigger.

16. The circuit of claim 5 wherein said time interval measuring means comprises a digital counter.

17. The circuit of claim 5 wherein said time interval measuring means comprises a microprocessor.

18. The circuit of claim 17 wherein said microprocessor is adapted to divide said first time interval by the sum of said first and second time intervals to provide a digital value which corresponds to the state of said potentiometer.

19. The circuit of claim 18 further comprising means for averaging, over time, a succession of said digital values.

20. The circuit of claim 5 wherein said discharging means comprises an output port of a microprocessor.

21. The circuit of claim 5 wherein the state of said potentiometer determines the output of a microprocessor.

22. The circuit of claim 5 wherein the state of said potentiometer determines the output of a dimming circuit.

23. The circuit of claim 5 wherein the state of said potentiometer determines the signal output of a wireless transmitter.

24. A circuit for sensing a state of a plurality of potentiometers, each having a resistive element and a wiper that electrically divides said resistive element into first and second ends, comprising, in combination:

(a) a capacitor having one end electrically connected to said wiper of each of said potentiometers, (b) means for applying a first predetermined voltage to alternately charge said capacitor through said first and second ends of said resistive element of a potentiometer selected from said plurality of potentiometers, (c) means for detecting when the voltage across said capacitor reached a second predetermined voltage, (d) means for measuring first and second time intervals, corresponding to said first and second ends of said selected potentiometer, respectively, between application of said first predetermined voltage and detection of said second predetermined voltage, and (e) means for discharging said capacitor during periods of time between said measurements, wherein the state of said selected potentiometer can be determined from said first and second time intervals.

25. The circuit of claim 24 wherein at least one of said potentiometers comprises a linear potentiometer.

26. The circuit of claim 24 wherein at least one of said potentiometers comprises a rotary potentiometer.

27. The circuit of claim 24 wherein at least one of said potentiometers comprises elongated conductive and resistive elements separated by a small gap and juxtaposed substantially co-extensively between substrates, at least one of which is flexible.

28. The circuit of claim 24 further comprising a current limiting resistor electrically connected between said capacitor and said wipers.

29. The circuit of claim 24 wherein said means for applying a voltage comprises an output port of a microprocessor.

30. The circuit of claim 24 further comprising means for continually selecting said potentiometers in sequential order.

31. The circuit of claim 24 further comprising means for selecting said potentiometers as they are adjusted.

32. The circuit of claim 24 wherein said detecting means comprises an input buffer of a microprocessor.

33. The circuit of claim 24 wherein said detecting means comprises a Zener diode.

34. The circuit of claim 24 wherein said detecting means comprises a diac.

35. The circuit of claim 24 wherein said detecting means comprises a Schmitt trigger.

36. The circuit of claim 24 wherein said time interval measuring means comprises a digital counter.

37. The circuit of claim 24 wherein said time interval measuring means comprises a microprocessor.

38. The circuit of claim 37 wherein said microprocessor is adapted to divide said first time interval by the sum of said first and second time intervals to provide a digital value which corresponds to the state of said selected potentiometer.

39. The circuit of claim 24 wherein the state of said selected potentiometer determines the output of a microprocessor.

40. The circuit of claim 24 wherein the state of said selected potentiometer determines the output of a dimming circuit.

41. The circuit of claim 40 wherein at least one of said potentiometers is located remotely from the remaining potentiometers.

* * * * *